US00RE39803E

(19) United States
(12) Reissued Patent
Danyluk et al.

(10) Patent Number: US RE39,803 E
(45) Date of Reissued Patent: Sep. 4, 2007

(54) NON VIBRATING CAPACITANCE PROBE FOR WEAR MONITORING

(75) Inventors: Steven Danyluk, Atlanta, GA (US); Anatoly Zharin, Minsk (BY); Elmer Zanoria, Peoria, IL (US); Lennox Reid, Houston, TX (US); Kenneth Hamall, Westchester, OH (US)

(73) Assignee: Georgia Tech Research Corporation, Atlanta, GA (US)

(21) Appl. No.: 09/846,835

(22) Filed: May 1, 2001

Related U.S. Patent Documents

Reissue of:
(64) Patent No.: 5,974,869
Issued: Nov. 2, 1999
Appl. No.: 08/971,101
Filed: Nov. 14, 1997

U.S. Applications:
(60) Provisional application No. 60/030,814, filed on Nov. 14, 1996.

(51) Int. Cl.
*G01R 27/26* (2006.01)
*G01B 7/34* (2006.01)
*G01B 21/30* (2006.01)
*G01N 27/22* (2006.01)

(52) U.S. Cl. ..... 73/105; 73/104; 324/458; 324/663; 324/686

(58) Field of Classification Search ..... 73/104, 73/105; 324/457, 458, 663, 686, 690
See application file for complete search history.

(56) References Cited

U.S. PATENT DOCUMENTS 4,295,092 A * 10/1981 Okamura ..... 324/671
4,481,616 A 11/1984 Matey
4,973,910 A * 11/1990 Wilson ..... 324/457
5,087,533 A 2/1992 Brown
5,136,247 A 8/1992 Hansen
5,270,664 A * 12/1993 McMurtry et al. ..... 324/690
5,272,443 A * 12/1993 Winchip et al. ..... 324/662
5,293,131 A * 3/1994 Semones et al. ..... 324/662
5,315,259 A * 5/1994 Jostlein ..... 324/690
5,369,370 A * 11/1994 Stratmann et al. ..... 324/663
5,517,123 A * 5/1996 Zhao et al. ..... 324/458
5,583,443 A * 12/1996 McMurtry et al. ..... 324/601
5,723,980 A 3/1998 Haase et al.

FOREIGN PATENT DOCUMENTS

DE 297509 A * 1/1992

OTHER PUBLICATIONS

B Scruton and B. H. Blott, A High Resolution Probe For Scanning Electrostatic Potential Profiles Across Surfaces; Journal of Physics E: Scientific Instruments (May 1973), pp. 472–474; vol. 6, No. 5, Printed in Great Britain.

* cited by examiner

*Primary Examiner*—Daniel S. Larkin
(74) *Attorney, Agent, or Firm*—Foley & Lardner LLP

(57) ABSTRACT

A non-vibrating capacitance probe for use as a non-contact sensor for tribological wear on a component. The device detects surface charge through temporal variation in the work function of a material. A reference electrode senses changing contact potential difference over the component surface, owing to compositional variation on the surface. Temporal variation in the contact potential difference induces a current through an electrical connection. This current is amplified and converted to a voltage signal by an electronic circuit with an operational amplifier.

37 Claims, 13 Drawing Sheets

-- Prior Art --

NON VIBRATING CAPACITANCE PROBE FOR WEAR MONITORING

Matter enclosed in heavy brackets [ ] appears in the original patent but forms no part of this reissue specification; matter printed in italics indicates the additions made by reissue.

STATEMENT OF RELATED APPLICATIONS

This application is based and claims priority on United States of America provisional patent application Ser. No. 60/030,814, filed on Nov. 14, 1996.

STATEMENT OF GOVERNMENT INTEREST

Part of the work for this invention was funded by the United States of America Office of Naval Research under contracts numbers N00014-95-1-0903 and N00014-94-1-1074. The government of the United States of America has certain rights to this invention.

BACKGROUND OF THE INVENTION

1. Field of the Invention

The present invention generally relates to non-contact sensors for monitoring surface variations of a component part, and more specifically relates to a non-vibrating capacitance probe which uses a variable capacitor to measure the contact potential difference between two surfaces, generally on the same component part, and thereby recognizes surface variations such as wear of an object subjected to, for example, a sliding contact.

2. Technical Field

Mechanical systems such as heat combustion engines have components that are dynamically in contact with another body. These components are subjected to cyclic motions that can involve impact loading, shear straining, plastic deformation, frictional heating, and fatigue of subsurface regions. A combination of these mechanisms often leads to surface damage that impairs the performance of the component. In addition, the chemical interaction between the component surface and surrounding fluids also can accelerate surface degradation. Such problems, if unattended, can result in catastrophic malfunction of the machine and even compromise operational safety. In this regard, it is desirable to monitor the surface condition of a critical tribocomponent. The design of sensors to monitor the surface condition of the tribocomponents and the operation of machinery depends largely on the nature of tribological application.

A surface-monitoring method that exploits the spatial variation in the work function of a material is presented herein. The work function refers to an energy barrier to prevent the escape of electrons from the surface of the material. The work function is governed by the physiochemical nature of the surface and also depends on the environmental conditions. From a tribological standpoint, the work function is a useful parameter for evaluating mechanical deformation features such as dislocation pile-ups and residual stresses. For example, it has been demonstrated that a metal subjected to different degrees of compressive stress exhibits a variation in the work function. Craig, P. P. and Radeka, V., "Stress Dependence of Contact Potential: The ac Kelvin Method," Rev. Sci. Instrum., Vol. 41, pp. 258–264, 1969. The present invention is a non-vibrating capacitance probe as modified from that of the Kelvin-Zisman method, Zisman, W. A., "A New Method of Measuring Contact Potential Differences in Metals," Sci. Instrum., Vol. 3, pp. 367–370, 1932, that uses a variable capacitor to measure the contact potential difference (CPD) between two surfaces.

SUMMARY OF THE INVENTION

Briefly described, in a preferred form, the present invention monitors the surface variations, such as surface wear, of a component. The surface wear is measured by the spatial variation in the work function of the component. The work function refers to an energy barrier to prevent the escape of electrons from the surface of the component. The invention detects the surface charge of the surface of the component through temporal variation in the work function of the component.

The present invention generally comprises the novel combination of a means for supporting the component and a non-vibrating capacitance probe, and the use of the non-vibrating capacitance probe in this combination to carry out the wear monitoring function of this invention. The component and non-vibrating probe are located in close proximity to each other. The relative motion between the component and the non-vibrating probe, the distance between them, and the contact potential difference between them, all are monitored. The work function of the component is found by monitoring the current induced by contact potential difference in the non-vibrating probe and relating it to the known work function of the electrode in the probe.

The present invention is directed to a non-vibrating capacitance probe which may be used as a non-contact sensor for tribological wear. Specifically, the present invention is a device which detects surface charge through temporal variation in the work function of a material. An artificial spatial variation in the work function is imposed on a shaft surface by coating a segment along the shaft circumference with a metal paint wherein the paint is compositionally different than the shaft surface. As the shaft rotates, the reference electrode senses changing contact potential difference with the shaft surface, owing to compositional variation. Temporal variation in the contact potential difference induces a current through an electrical connection. This current is amplified and converted to a voltage signal by an electronic circuit with an operational amplifier. The magnitude of the signal decreases asymptotically with the electrode-shaft distance and increases linearly with the rotational frequency.

In one embodiment of the apparatus, the component to be monitored for surface variations either is a cylindrical shaft composed of the material to be monitored, or wear-tested, or is a cylindrical shaft coated with the material to be monitored, or wear-tested. The component is supported by roller bearings on both ends of the shaft, allowing rotation of the shaft along its axis. The shaft is rotated by a motor and the rotational speed of the shaft is monitored. A non-vibrating capacitance probe is mounted on an xyz-positioning system, and a monitor detects the spacing between the shaft surface and probe. A monitoring device interprets the current induced in the non-vibrating capacitance probe as a difference in work function between the component and the known work fimction of the reference electrode in the probe. The process of measuring the work function of the component comprises the creation of relative rotational motion between the component and the non-vibrating capacitance probe. The relative motion of the component and probe, and the distance between the component and probe also are monitored.

One application of the non-vibrating capacitance probe is for detecting surface wear of an object subjected to sliding contact. One technique is to apply a thin coating of a material on the sliding body that is compositionally different from the substrate. Partial removal of this coating due to sliding contact creates sites where the substrate material is exposed. Formulation of these sites create lateral compositional variation, thus, heterogeneity in the work function of the wear surface. This yields an induced-current pattern that is unique from that of the unworn surface coating.

Accordingly, it is a primary object of the present invention to provide an apparatus comprising a non-vibrating capacitance probe which can be used as a non-contact sensor for tribological wear.

It is another object of the present invention to provide an apparatus comprising a non-vibrating capacitance probe which can be miniaturized and installed in systems that have moving parts.

These and other objects, advantages, and features of the present invention will become apparent to those skilled in the art upon reading the following specification in conjunction with the accompanying drawing figures, in which like reference numerals designate like parts throughout the several views.

DESCRIPTION OF THE DRAWING FIGURES

Figure 3A:
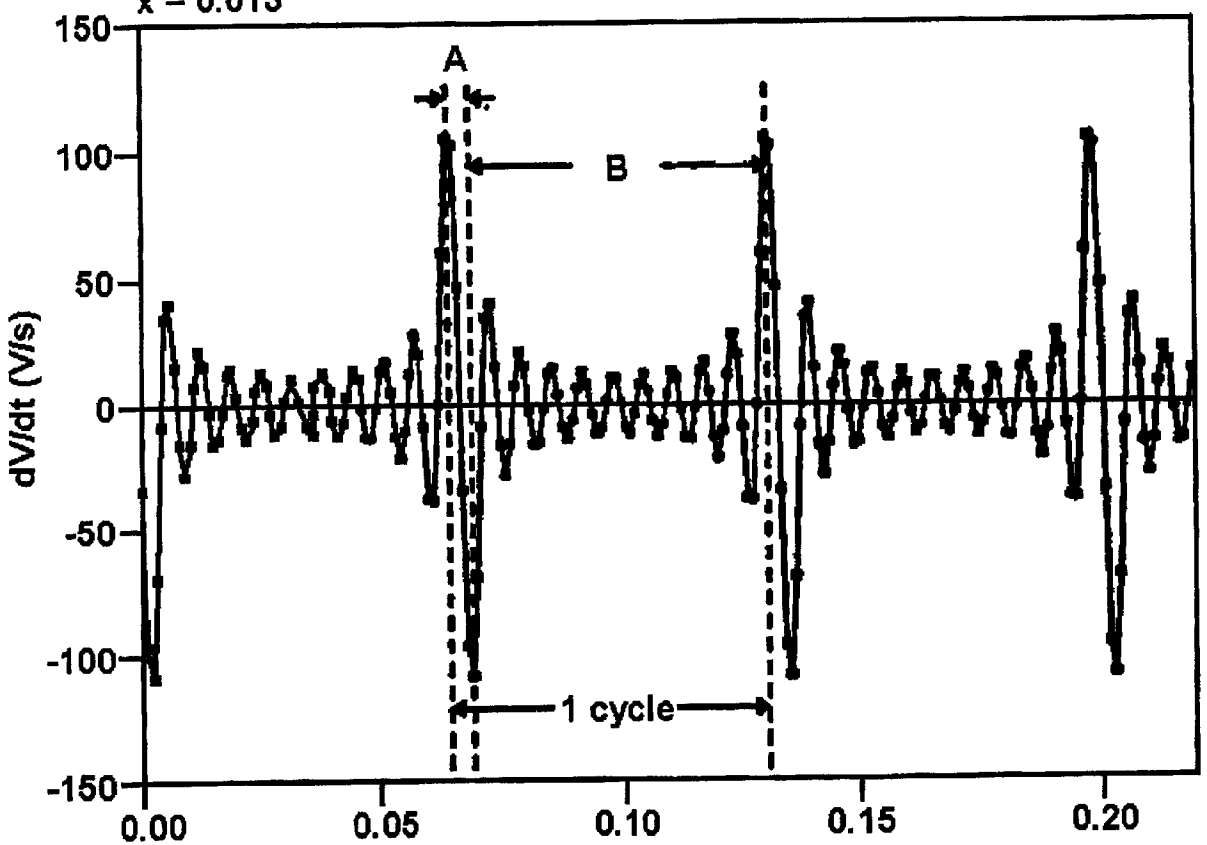
Figure 3B:
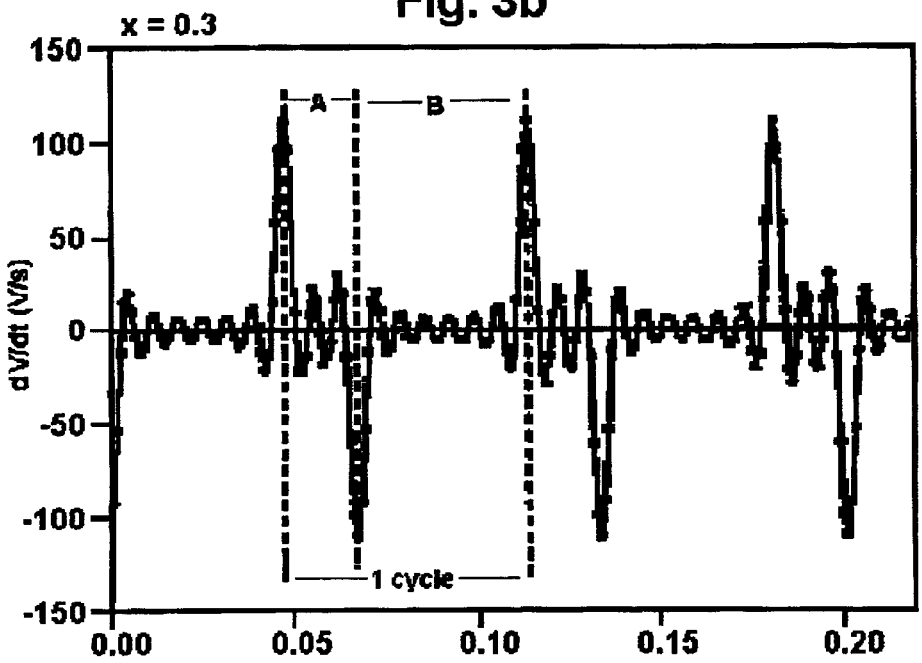

FIGS. 3(a) and 3(b) show the theoretical variation of dV/dt with time for different values of x.

Figure 4:
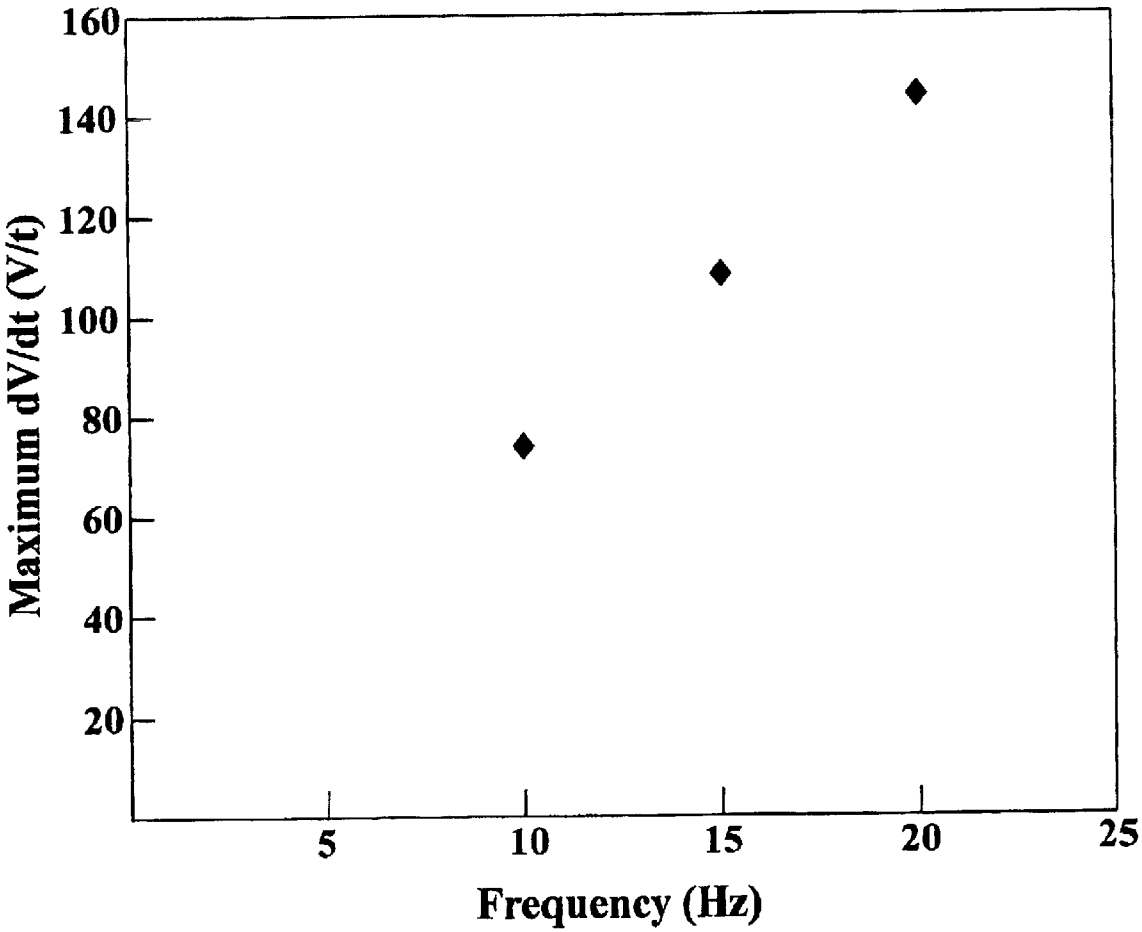

FIG. 4 shows the theoretical maximum dV/dt plotted as a function of frequency.

Figure 5:
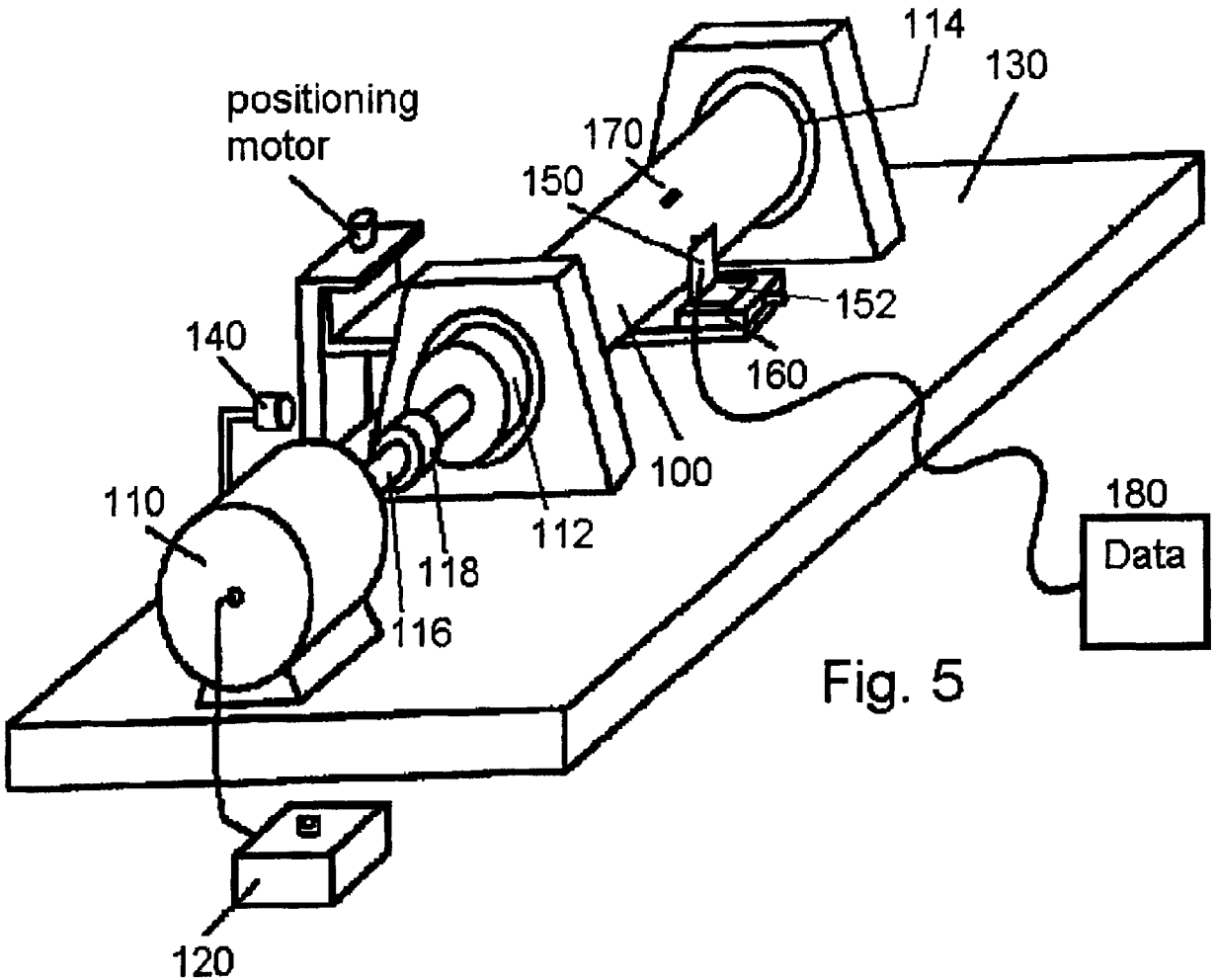

FIG. 5 shows the experimental set-up for a preferred embodiment of the present invention.

Figure 6:
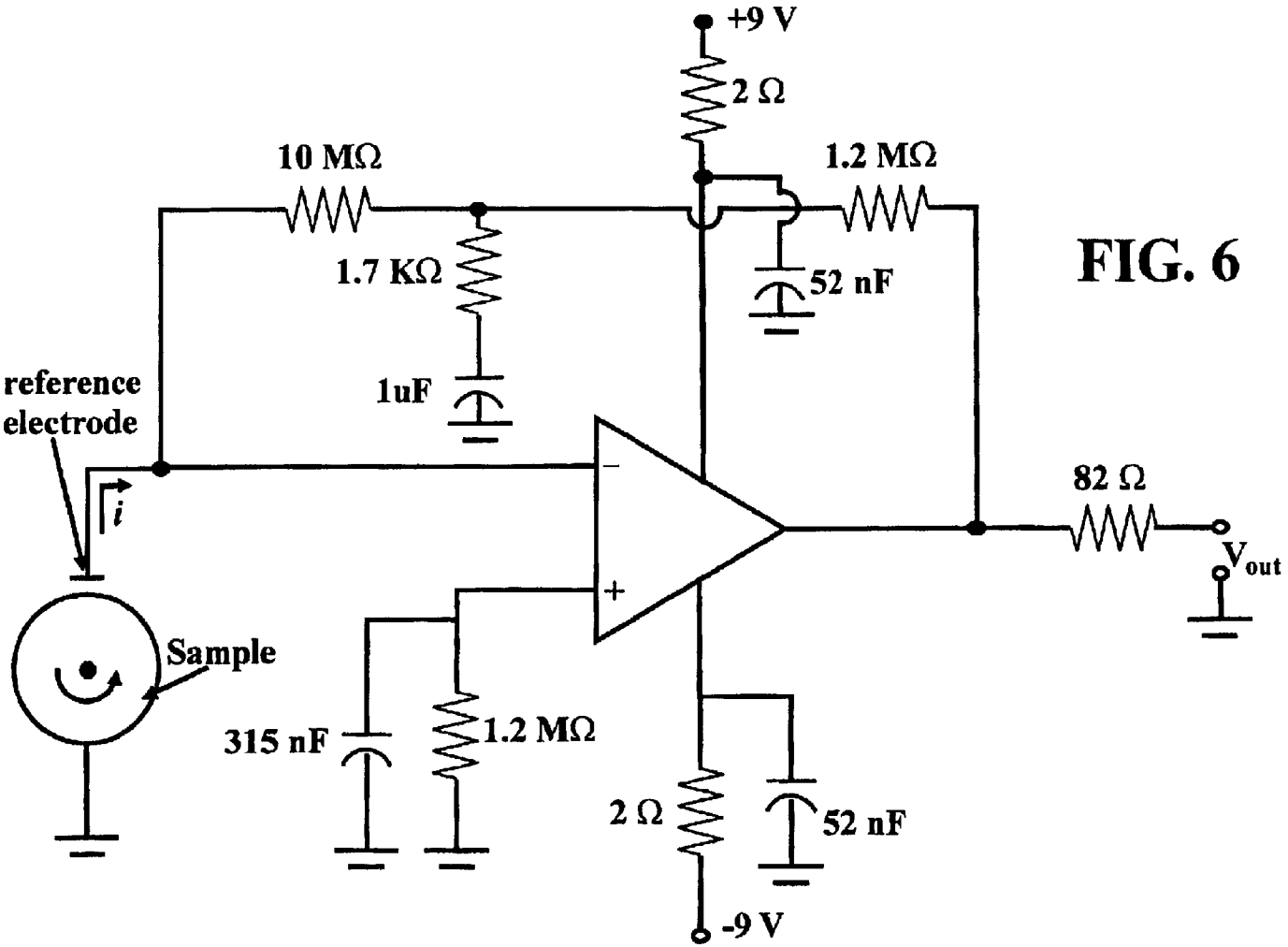

FIG. 6 is a circuit diagram of the non-vibrating capacitance probe, according to one form of the present invention.

Figure 7A:
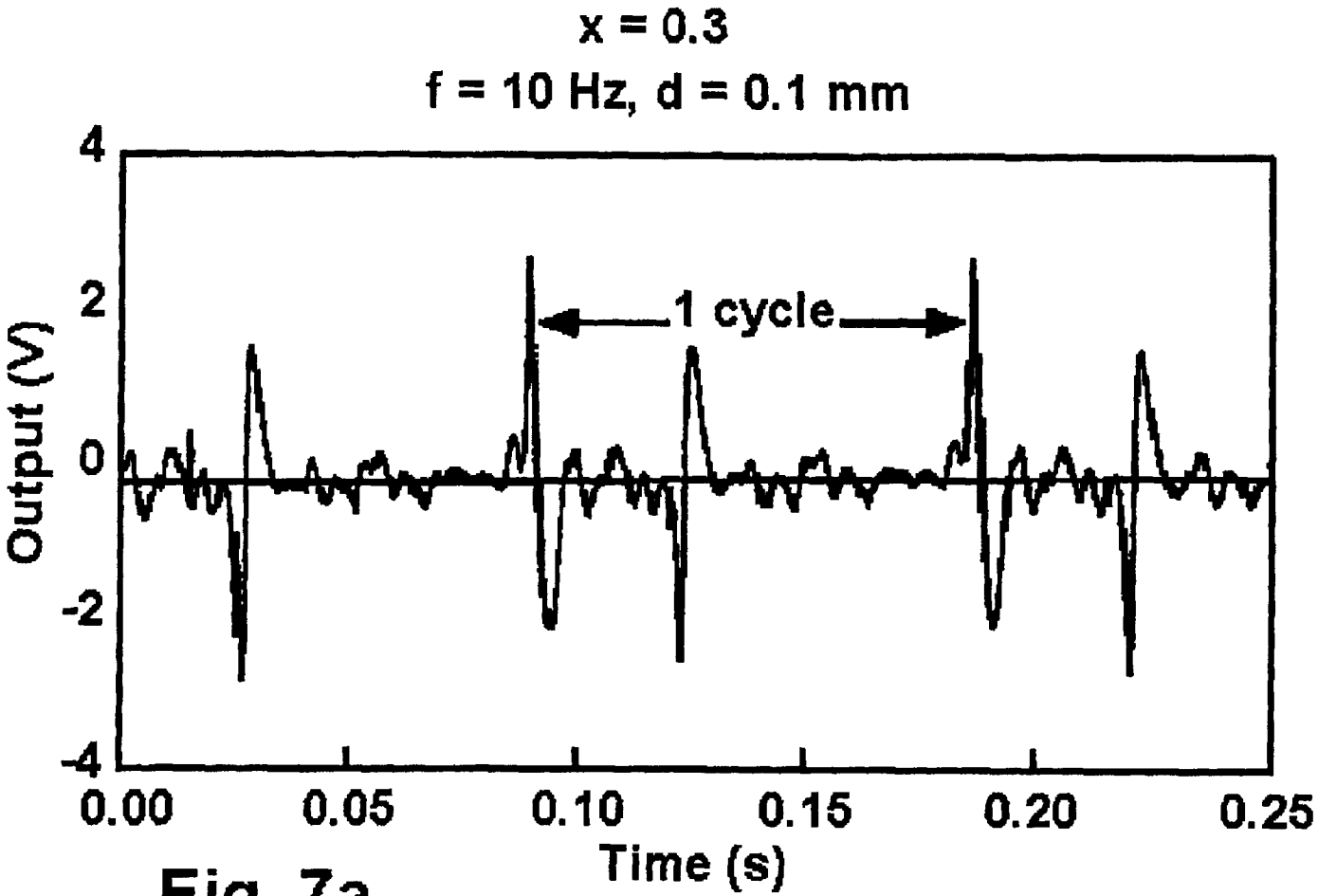
Figure 7B:
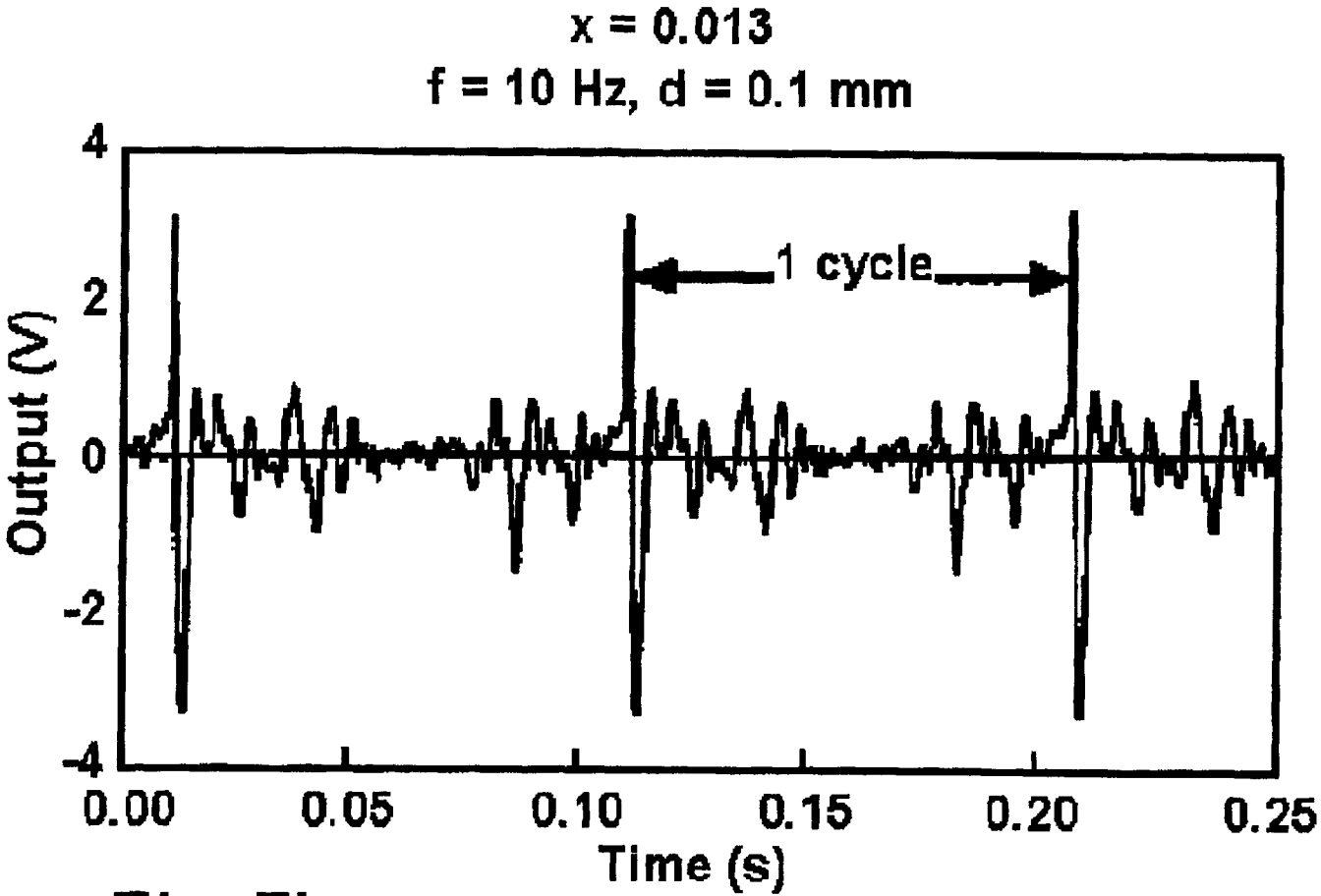

FIGS. 7(a) and 7(b) show experimental samples of probe output signal for different values of x.

Figure 8:
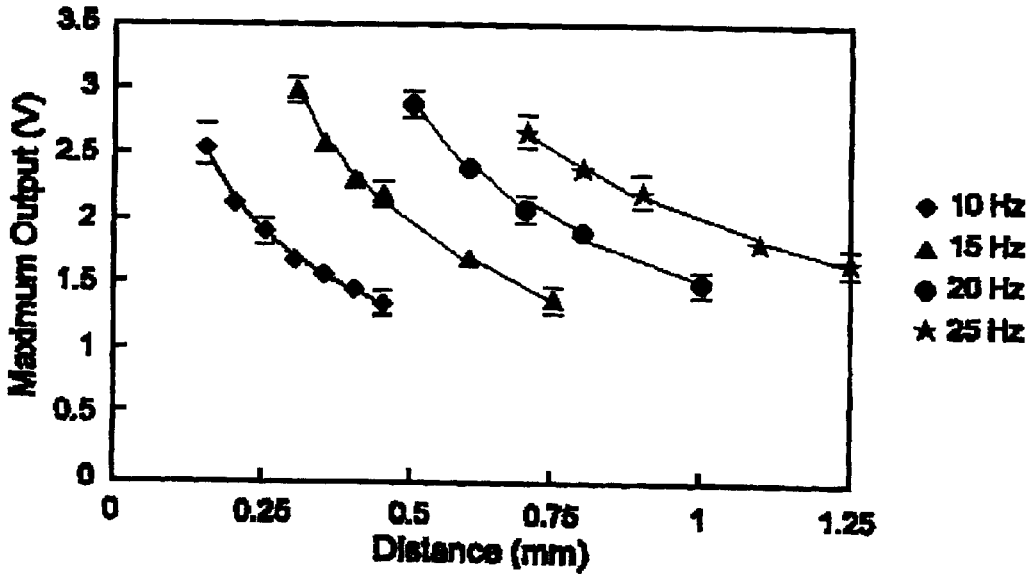

FIG. 8 shows the magnitude of maximum output plotted as a function of probe-sample distance.

Figure 9:
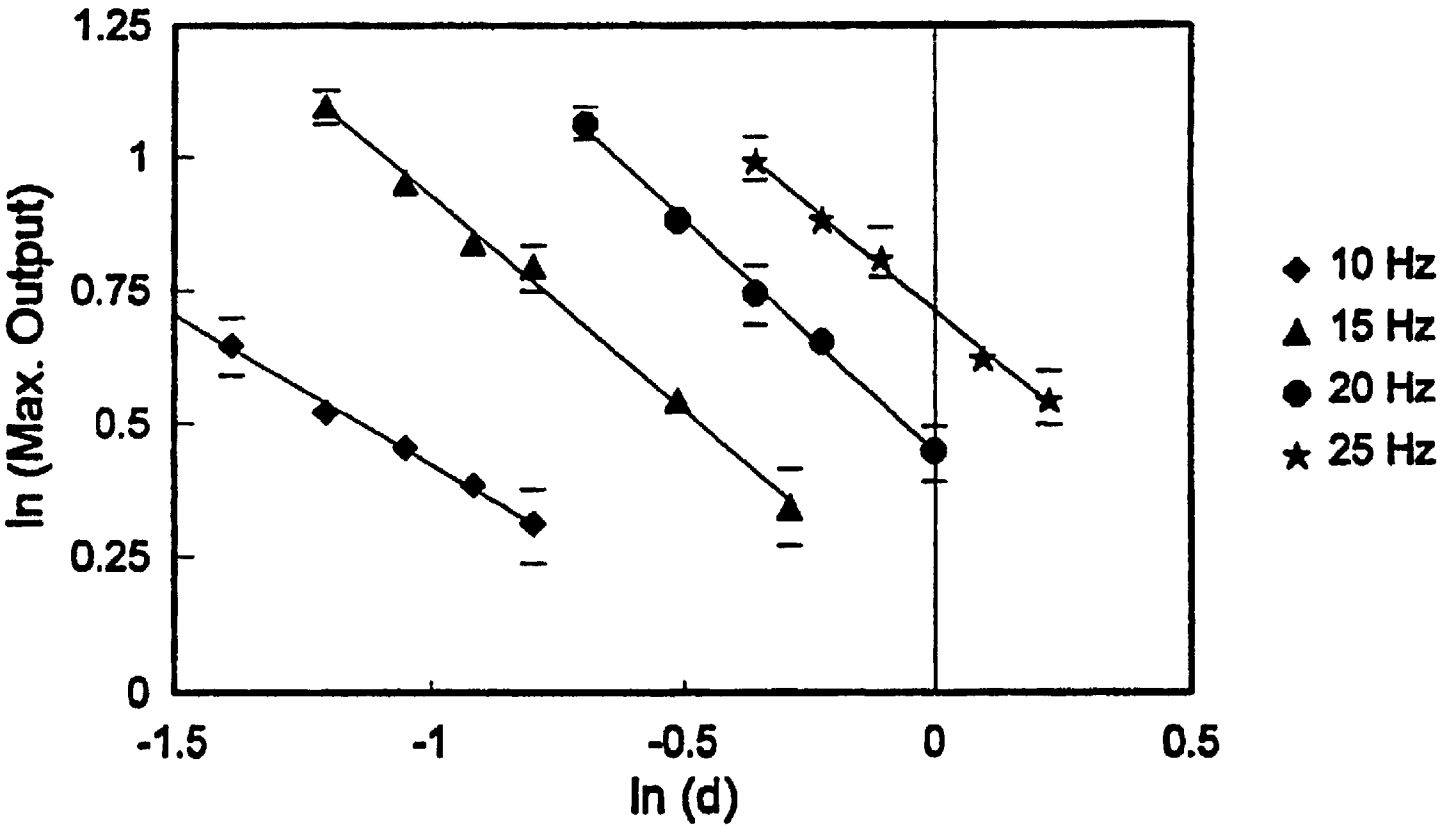

FIG. 9 shows a linearized plot of maim output as a function of probe distance.

Figure 10:
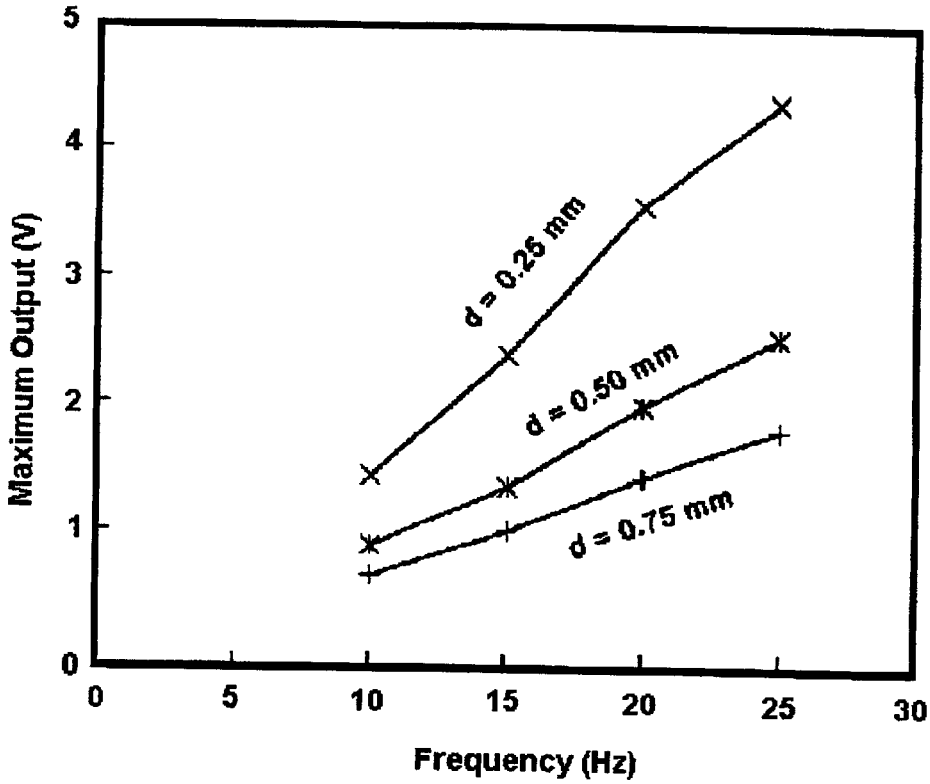

FIG. 10 shows the magnitude of maximum output plotted as a function of rotational frequency.

DETAILED DESCRIPTION OF A PREFERRED EMBODIMENT

Theoretical

The theoretical background detailed below provides a description of the Kelvin-Zisman method to monitor a surface probe, and demonstrates the operation of the probe on a rotating shaft.

Kelvin-Zisman Probe

Figure 1:
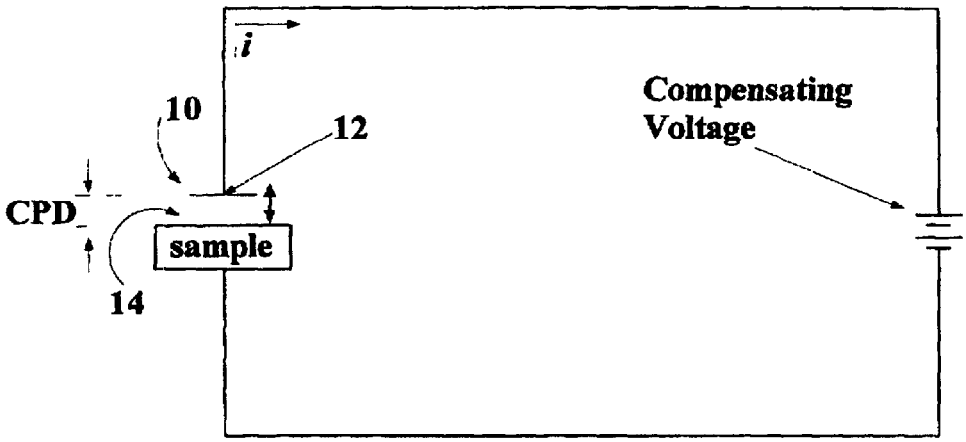
FIG. 1 is a schematic of the Kelvin-Zisman method (prior art).

Referring to FIG. 1, the Kelvin-Zisman technique is accomplished by creating a parallel plate dynamic or vibrating capacitor 10 by vibrating one plate, the reference electrode 12, relative to a second plate, the sample surface 14 of interest. The surface 14 corresponds to the component subject to wear or to having other surface variations. The vibration induces a current flow, i, which can be described in terms of the geometry of the capacitor 10 and difference in work function between the reference electrode 12 and surface 14. If the work function of the reference electrode 12, $\phi_{ref}$, is known, then the changes in the work function of the surface 14, $\phi_{desired}$, can be related to whatever experimental conditions are chosen. The general equation for the inducted current is $$i=V(dC/dr)+C(dV/dr) \quad (1)$$

where V, the CPD voltage, is defined by $$V=(\phi_{ref}-\phi_{desired})/e \quad (2)$$

and C, the capacitance, is expressed as $$C=\epsilon_r\epsilon_0 A/d \quad (3)$$

where e is the charge of an electron $\epsilon_r$ is the relative dielectric constant, $\epsilon_0$ is the permitivity in free space, A is the area of the reference electrode, and d is the spacing between the surfaces.

A typical experimental condition involves a reference electrode that does not detect a varying $\phi_{desired}$, thus, the term dV/dt in equation 1 is assumed to be zero. In most CPD-measurement studies, such a condition is implemented by having the vibrating reference electrode fixed in position on a particular site of the sample surface. The induced current is contributed solely by the change in the capacitance owing to the sinusoidal variation in d expressed as $$d=d_0+d_1\sin\omega t \quad (4)$$

where $d_0$ is the mean spacing, $d_1$ is the amplitude, $\omega$ is the angular frequency, and t is the time. Substituting equation 4 into equation 3 and 1 yields $$i=-V\epsilon_r\epsilon_0 A d_1 \cos \omega t/(d_0+d_1 \sin \omega t)^2 \quad (5)$$

The Kelvin-Zisman technique to measure V is to provide a compensating voltage, $V_C$, to the capacitor 10, shown in FIG. 1, so that i=0. The dc voltage could be applied either externally or through a feedback circuit via a phase sensitive detector.

Inventive Embodiment

In preferred form, the present invention comprises a non-vibrating capacitance probe for surface wear monitoring. The probe of the present invention forms a capacitor 10 between a reference electrode 12 and a surface 14 of interest, as described by the Kelvin-Zisman technique above. However, the spacing between the two surfaces, the electrode 12 being the first surface and the surface 14 being the second surface, in the present invention is fixed. Instead of the variable capacitance, the current is induced by the temporal change in CPD. Therefore, in reference to equation 1, the formulation for the induced current is simplified to $$i=C(dV/dt) \quad (6)$$

Varying the CPD with time can be achieved by imposing a lateral displacement between the reference electrode 12 and the sample surface 14 with a heterogeneous work function. A combination of equation 6 with equation 3, which yields $$i=\epsilon_r\epsilon_0 A(dV/dt)/d, \quad (7)$$

suggests that the magnitude of the induced current decreases asymptotically with the capacitor spacing, and increases with the area of the reference electrode and the rate of CPD change.

Figure 2A:
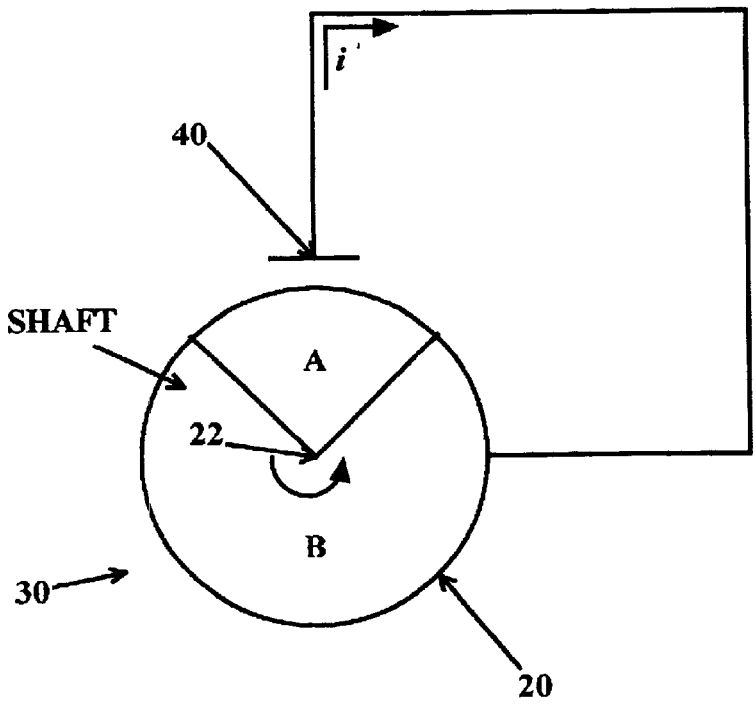
FIG. 2 is a graph of CPD variation measured by the present invention between the reference electrode and a rotating cylindrical surface composed of materials A and B.
Figure 2B:
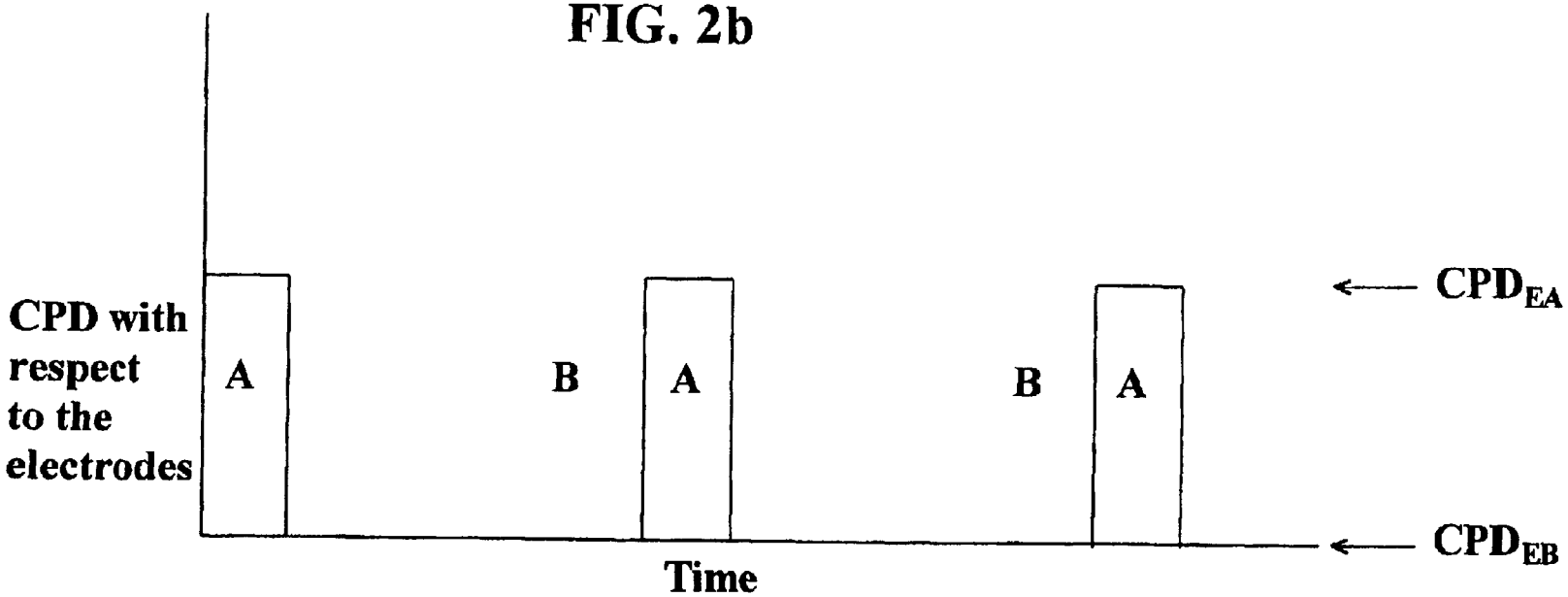

One embodiment of the present invention is the scanning of a cylinder 30 having a cylindrical surface 20 rotating along its longitudinal axis 22, as shown in FIG. 2. Using the geometry depicted in FIG. 2, along the circumference of the cylinder 30, part of the surface 20 consists of material A, and the rest of the surface 20 consists of material B; each material having a unique work function.

As the cylinder 30 rotates at a constant speed, the reference electrode 40 senses a contact potential difference with material A, $CPD_{EA}$, and another potential with material B, $CPD_{EB}$. Also assume the $CPD_{EB}$ is zero. The variation in the CPD with time can be described by a rectangular wave function V(t) with an amplitude $CPD_{EA}$, as shown in FIG. 2. The Fourier series of the function is $$V(t)=V'x+V'/\Pi\{\Sigma[(\sin(2\Pi nx)/n)\cos(w\Pi fnt)]+[(1-\cos(w\Pi nx)/n)\sin(2\Pi fnt)]\} \quad (8)$$

wherein $V'=CPD_{EA}-CPD_{EB}$, in volts, f is the fundamental frequency which is equivalent to the rotational frequency, x is the ratio of the arc length of A to the circumference of the cylinder, and n=1, 2, 3, . . . ∞. The derivative of this function is defined by $$dV/dt=-2V'f\{\Sigma[(\sin(e\Pi nx)/n)\sin(2\Pi fnt)]+[(1-\cos(2\Pi nx)/n)\cos(2\Pi fnt)]\} \quad (9)$$

For $CPD_{EB}\neq 0$, the derivative of V(t) is still identical to equation 9 where the dc component is eliminated.

FIG. 3 shows plots of equation 9 for x values of 0.013 and 0.3. For these calculations, V'=1, f=15 Hz, and n=1 to 10. Each cycle of the wave consists of two major peaks, one with positive, maximum, value, and the other with negative, minimum, value. These peaks define the boundaries of material A where there are sharp changes in the CPD. The gap between the peaks widens as the length fraction of A increases.

Equation 9 indicates that the magnitude of the peak depends on the fundamental frequency. This is illustrated in FIG. 4 that reveals a linear increase in maximum dV/dt from 10 to 20 Hz. For this plot, x is fixed at 0.013 and V' and n are the same as for FIG. 3.

It should be noted that waves with smaller amplitude separate the major peaks as shown in FIG. 3. There should be a straight line (dV/dt=0) instead because of the absence of CPD variation between material boundaries. The appearance of minor waves between the large peaks is attributed to the limited number of harmonics included in the calculation. With the higher number of harmonics, the amplitude of these waves approaches zero.

Another embodiment of the present invention, as shown in FIG. 5, comprises an aluminum shaft 100 rotated by a stepper motor 110. Both ends of the shaft 100 are supported by roller bearings 112, 114. One end of the shaft 100 is connected to the motor spindle 116 with a coupling 118. Interfaced with the motor 110 is a control box 120 for regulating the rotational speed of the shaft 100. The entire mechanical assembly is mounted on a vibration-isolation table 130. The rotational frequency of the shaft 100 is monitored by a tachometer 140. In the described sets of experiments, the rotational frequency was set at 10, 15, 20, and 25 Hz, corresponding to 600, 900, 1200, and 1500 rpm. The experimental shaft 100 was about 432 mm in length and about 50.8 mm in diameter.

A non-vibrating capacitance probe 150 is mounted on an xyz positioning system 160 which is mechanically isolated from the above set-up. Stepper motors, not shown, control the lateral motion of the probe 150 along the longitudinal axis of the shaft 100 and the vertical position. The probe 150 is positioned such that a reference electrode 152 in the probe 150 is perpendicular to the shaft 100 surface. A separate positioning stage with a translational resolution of 0.01 mm is used to manually adjust the spacing between the shaft 100 and the reference electrode 152. Spacings ranging from 01. to 1.25 were used in experimentation.

Artificial variation in the work function was imposed on the sample shaft 100 surface by coating a segment along the shaft 100 circumference with a colloidal silver paint. Most of the tests were conducted for a silver strip 170 with an arc length x that was 1.3/100, or 0.013, of the circumferencial length of the shaft 100. One test was performed for a separate coating with a length x fraction of 0.3. The coating strips were approximately 14-μm thick and 5-mm wide for this experimentation.

The reference electrode 152 of the probe 150 was made of lead wire with a cross-sectional area of approximately 0.446 $mm^2$. Electrical connection between the sample shaft 100 and the common ground of the probe's 150 electronic circuit was maintained through a brush in contact with the shaft 100. The current induced by the time-varying CPD between the electrode 152 and rotating shaft 100 surface was converted to a voltage output, as shown in FIG. 6, via a high ohmic circuit with a gain factor of $3.9\times10^9$ V/amp. The operational amplifier in the circuit received a dc power of ±9 V. The voltage output of the amplifier was recorded by a data acquisition system 180 at a rate of 10 kHz.

FIG. 7a shows an example of signal output for the silver strip 170 with a length fraction of 0.013. The signal exhibits a series of large waves, separated by fluctuations with smaller amplitudes. This pattern is identical to that of the theoretical signal which is calculated for a similar length fraction, shown in FIG. 3a. The time interval between the large waves corresponds to the rotational frequency of the shaft 100. The interval between the maximum and minimum peaks of each wave packet represents the traverse of the probe 150 along the arc length of the silver strip 170. As per FIG. 2, upon entry into the silver strip 170, the reference electrode 152 senses an abrupt shift in the contact potential difference from aluminum to silver. At this point, the rate of change in CPD, ie., dV/dt, is maximum (equation 7). As the reference electrode 152 moves from silver to aluminum, it senses another sharp change in CPD but with a dV/dt of reverse polarity. In accordance with this model, the interval between the maximum and minimum points of the large peaks is longer for the silver strip 170 with a length fraction of 0.3, shown in FIG. 7b.

An interval of minor waves separates the large ones as shown in FIG. 7a. This interval could be the electrical signature of uncoated aluminum The fluctuation could reflect microstructural variation in the aluminum surface that also gives rise to heterogeneity in the work function. The microstructural variation could be linked to the machining history of the shaft 100.

The amplitudes of both the maximum and minimum peaks of the major wave is influenced strongly by the rotational frequency of the shaft 100 and the capacitance spacing. As an example, a quantitative analysis of the maximum peak measured for a silver strip with a length fraction of 0.013 is presented. FIG. 8 shows that the magnitude of the maximum peak declines non-linearly from 2.8 to 0.9 V with probe distance. It should be noted that the curves in FIG. 8 have identical shape; however, they shift to higher voltages as the rotational frequency increases from 10 to 25 Hz.

A mathematical equation for each curve in FIG. 8 can be derived by linearization. This is done by plotting the natural logarithm of the maximum voltage ($V_{max}$) against that of the distance, and then calculating the slope (s) and y-intercept (y) through linear regression. FIG. 9 reveals that the fit ($r^2$) of the linearized curves ranges from 0.99 to 1.00. Such excellent $r^2$ values confirms the validity of the curve fitting technique being applied. Rearranging the linear equation $$\ln(V_{max})=[s \times \ln(d)]+y \quad (10)$$

yields an asymptotic expression for $V_{max}$ $$V_{max}=c/d^3 \quad (11)$$

where $c=e^y$. Equation 11 takes into account the negative slope indicated by the linearized plots in FIG. 9. Table 1 shows the values of c and s for each rotational frequency.

TABLE 1

| Frequency (Hz) | c | s |
|---|---|---|
| 10 | 0.874 | 0.6 |
| 15 | 2.230 | 0.8 |
| 20 | 1.565 | 0.9 |
| 25 | 2.040 | 0.8 |

The empirical equation for $V_{max}$ conforms with the predicted model for the induced current (equation 7). Both equations are asymptotic; however, the experimental value of s in equation 9 range from 0.6 to 0.9. Except for f=10 Hz, these values are slightly below 1, which is the predicted value. It should be noted that the probe signal is acquired through a current-to-voltage conversion circuit with a gain factor of $3.9\times10^9$ V/amp. Taking this and equation 7 into account, it is proposed that the numerator, c, in the empirical equation, represents a product of the induced current, conversion factor, dielectric constants and dV/dt. Among these parameters, dV/dt which increases linearly with the rotational frequency, shown in FIG. 4, is variable.

FIG. 10 shows that, at a constant d, the magnitude of the maximum peak increases linearly with the rotational frequency and the slope for each line increases with decreasing spacing distance.

Therefore, the applicability of the non-vibrating capacitance probe for detecting surface variation in the work function has been presented. This variation is reflected by the nature of the current induced by the changing contact potential difference between the reference electrode and the surface in question. The magnitude of the induced current which indicates the sensitivity of the probe, decreases asymptotically with distance between the probe and sample, and increases linearly with the rate of CPD change. These results are consistent with the theoretical model.

While the invention has been disclosed in its preferred forms, it will be apparent to those skilled in the art that many modifications, additions, and deletions can be made therein without departing from the spirit and scope of the invention and its equivalents as set forth in the following claims.

What is claimed is:

1. An apparatus for monitoring surface variations on a component, said apparatus comprising:

(a) a non-vibrating capacitance probe;

(b) means for positioning said non-vibrating capacitance probe in proximity to the component; and (c) means for measuring the contact potential difference *arising from relative motion* between the component and said non-vibrating capacitance probe *and changes in the contact potential difference being characteristic of correlated surface variations of the component.*

2. An apparatus according to claim 1, further comprising [a] means for measuring the relative motion between the component and said non-vibrating capacitance probe.

3. An apparatus according to claim 2, further comprising means for regulating the relative motion between the component and said non-vibrating capacitance probe.

4. An apparatus according to claim 1, further comprising means for measuring the spatial distance between the component and said non-vibrating capacitance probe.

5. An apparatus according to claim 1, [further comprising a means for supporting the component] *further including means for scanning which provides spatially continuous scanning of the probe relative to the component.*

6. An apparatus according to claim 5, *further comprising a means for supporting the component,* wherein said means for positioning said non-vibrating capacitance probe in proximity to the component is fixed relative to said means for supporting the component.

7. An apparatus according to claim 1, wherein said surface variations [is] *comprise* surface wear.

8. A process for monitoring surface variations on a component, comprising the following steps:

(a) imparting relative motion between the component and a non-vibrating capacitance probe;

(b) monitoring the relative motion between the component and the non-vibrating capacitance probe; and (c) monitoring the contact potential difference between the component and the non-vibrating capacitance probe *with changes in the contact potential difference characteristic of correlated surface variations of the component.*

9. A process according to claim 8, further comprising the step of monitoring the distance between the said test surface and the non-vibrating capacitance probe.

10. A process according to claim 9, wherein the surface variation is surface wear.

*11. A non-contact detector for measuring a property of a sample comprising, a non-vibrating sensor being in electrical communication with a sample, the sample and the non-vibrating sensor having different work functions and being separated from one another by a characteristic distance, and a measurement device for measuring a current directly related to a temporal variation of a contact potential difference between the sample and the sensor, thereby measuring a property of the sample.*

*12. The non-contact detector of claim 11, the sensor being a non-vibrating sensor which is structurally moved relative to the sample.*

*13. A non-contact detector for measuring at least one of chemical properties and tribological wear of a component comprising:*

*(a) a non-vibrating sensor having a sensor work function, the non-vibrating sensor being in proximity to the component at a selected distance from the component and the non-vibrating sensor scanned relative to the component, and the component having a component work function; and*

*(b) a measurement device for measuring a temporal variation in a property relatable to the component work function and the temporal variations in a property selected from the group of a correlated change in surface composition of the component, change in the tribological wear of the component and spatial variations of the component.*

*14. The non-contact detector of claim 13, the sensor work function being different than the component work function.*

*15. The non-contact detector of claim 14, the measurement device for measuring the temporal variation in the component work function wherein the property is determined by measuring an induced current which is related to a temporal change in contact potential difference between the component and the sensor.*

*16. An apparatus for monitoring surface changes on a component, said apparatus comprising:*

*(a) a non-vibrating capacitance probe;*

*(b) a placement device for positioning the non-vibrating capacitance probe in proximity to the component and a system for scanning the probe relative to the component; and*

*(c) a first measurement device for measuring a property which is relatable to the contact potential difference between the component and the non-vibrating capacitance probe and the property relatable to the contact potential difference arising from at least one of a compositional surface change of the component, spatial variation and tribological wear.*

*17. An apparatus according to claim 16, further comprising a second measurement device for measuring the relative motion between the component and the non-vibrating capacitance probe.*

*18. An apparatus according to claim 17, further comprising a regulator capable of regulating the relative motion between the component and the non-vibrating capacitance probe.*

*19. An apparatus according to claim 16, further comprising a third measurement device for measuring a nearest spatial distance between the component and the non-vibrating capacitance probe.*

*20. An apparatus according to claim 16, further comprising a support for supporting the component.*

*21. An apparatus according to claim 20, wherein the placement device for positioning the non-vibrating capacitance probe in proximity to the component is fixed relative to the support.*

*22. A capacitance probe for measuring at least one property of a sample, comprising:*

*(a) a reference electrode and a sample forming at least part of an electrical circuit, the reference electrode disposed adjacent the sample and having a characteristic closest separation distance between the sample and the reference electrode, the reference electrode maintained substantially fixed during measurement of the at least one property, and the sample and the reference electrode forming a capacitor element of the electrical circuit;*

*(b) a voltage source coupled to the reference electrode and being part of the electrical circuit; and*

*(c) a device for measuring current induced by activating the voltage source in the electrical circuit, the measured current arising from a temporal change in the contact potential difference between the reference electrode and the sample with the temporal change associated with a change of at least one of a compositional change of the sample, tribological wear of the sample and a change of distance between the reference electrode and the sample.*

*23. The capacitance probe of claim 22, the reference electrode being a non-vibrating reference electrode.*

*24. A non-contact detector for measuring at least one of tribological wear and chemical changes of a sample comprising, a non-vibrating sensor being in electrical communication with a sample, the sample and the sensor having different work functions and being separated from one another by a selected distance of closest approach and a measurement device for measuring a current related to a time varying change in the selected distance of closest approach between the sample and the sensor, thereby measuring the at least one of tribological wear and chemical changes of the sample.*

*25. The non-contact detector of claim 24 wherein the tribological wear comprises mechanical defect surface variations of the sample.*

*26. A method of sensing at least one of chemical properties and tribological wear of a sample comprising the steps of:*

*positioning a non-vibrating sensor in proximity to the sample, the sensor being separated by a selected distance from the sample;*

*scanning the non-vibrating sensor relative to the sample; and*

*measuring a current related to a contact potential difference between the sample and the sensor and analyzing the current to determine at least one of the chemical properties and tribological wear of the sample.*

*27. A method of sensing at least one of chemical properties and tribological wear of a sample comprising the steps of:*

*locating a non-vibrating sensor having a sensor work function in proximity to the sample having a sample work function, the sensor being separated by a selected distance from the sample;*

*scanning the non-vibrating sensor relative to the sample;*

*measuring an induced current between the sample and the sensor; and*

*determining at least one of chemical properties and tribological wear of the sample by relating the induced current to at least one of (i) a difference between the sensor work function and the sample work function and (ii) a variation in the selected distance from the sample.*

*28. A non-contact detector for measuring a work function characteristic of a material at the surface of a component comprising:*

*a sensor having a sensor work function, the sensor disposed in proximity to the component at a selected distance from the component, and the component having a component work function;*

*a mechanism to drive at least one of the component and the sensor laterally relative to one another; and*

*a measurement device for measuring a temporal variation in work function of difference between the sensor and the component over a spatial range along the component, arising from the sensor moving laterally relative to the component to determine variation of the component work function over the spatial range of the material and in turn properties of the surface of the component.*

*29. A non-contact detector for determining differences of contact potential difference at locations along the surface of a component having a component work function, comprising:*

*(a) a non-vibrating sensor having a sensor work function and when the non-vibrating sensor is disposed in proximity to and scanned relative to the component, a surface charge is detected as a result of the temporal change of the work function of the component; and*

*(b) a measurement system which uses the surface charge sensed by the non-vibrating sensor to determine a*

*contact potential difference for the component as the sensor is scanned relative to the surface of the component, the contact potential difference changes being characteristic of changes of composition of the material at the surface of the component along a spatial line of the component.*

*30. The non-contact detector as defined in claim 29 wherein the changes in the contact potential difference comprise microstructural variation of the component surface.*

*31. The non-contact detector as defined in claim 30 wherein the measurement system provides a quantitative analysis result for the surface of the component.*

*32. A non-contact detector for performing quantitative analysis of the surface of a component, comprising:*

*a sensor having a sensor work function and the sensor when disposed in proximity to the component and scanned relative to the component senses a temporal change of the work function when passing from one material to another material of the component along a spatial dimension of the component; and*

*a system for analyzing the temporal change of the work function to characterize at least one of composition and quantitative measure of dimensional changes at the surface of the component along the spatial dimension of the component.*

*33. A method of determining differences of contact potential difference for a component, comprising the steps of:*

*positioning a sensor near a component surface, the sensor having a sensor work function;*

*scanning the sensor laterally relative to the component along a line, the scanning generating a surface charge when a temporal change of the work function occurs along the line; and*

*measuring the surface charge over the line and characterizing at least one of composition and wear of the surface of the component.*

*34. A method of monitoring surface variations on a component, comprising the steps of:*

*positioning a non-vibrating capacitance probe near a component being monitored;*

*scanning the non-vibrating capacitance probe relative to the component; and*

*measuring along a line the contact potential difference between the component and said non-vibrating capacitance probe, with measured changes at points along the line of the contact potential difference being characteristic of correlated surface variations of the component.*

*35. A method according to claim 34, wherein the scanning step provides spatially continuous scanning of the probe relative to the component, thereby allowing mapping of the surface variations of the component.*

*36. A process for monitoring surface variations on a component, comprising the following steps:*

*(a) determining a contact potential difference for a component by imparting relative lateral motion between the component and a capacitance probe;*

*(b) monitoring the relative lateral motion between the component and the capacitance probe to identify location of surface variations on the component; and*

*(c) monitoring the contact potential difference between the component and the capacitance probe with changes in the contact potential difference characteristic of surface variations of the component which are then correlated to the location on the component.*

*37. The method as defined in claim 36 wherein the relative lateral motion maps a line of points on the component characteristic of the correlated surface variations of the component.*

* * * * *